(12) United States Patent
Kim et al.

(10) Patent No.: US 7,989,242 B2
(45) Date of Patent: Aug. 2, 2011

(54) ARRAY SUBSTRATE FOR LIQUID CRYSTAL DISPLAY DEVICE AND METHOD OF FABRICATING THE SAME

(75) Inventors: Byung-Geol Kim, Seoul (KR); Gee-Sung Chae, Incheon (KR); Jae-Seok Heo, Gyeonggi-do (KR); Woong-Gi Jun, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 222 days.

(21) Appl. No.: 12/318,047

(22) Filed: Dec. 19, 2008

(65) Prior Publication Data

US 2009/0309102 A1    Dec. 17, 2009

(30) Foreign Application Priority Data

Jun. 12, 2008 (KR) .................. 10-2008-0055048

(51) Int. Cl.
*H01L 21/336* (2006.01)
(52) U.S. Cl. ............ 438/30; 438/22; 438/496; 438/758; 438/287; 438/591; 257/E21.625; 257/E51.006; 257/E21.409
(58) Field of Classification Search .............. 438/30, 438/22, 496, 758, 287, 591; 257/E21.625, 257/E51.006, E21.409
See application file for complete search history.

(56) References Cited

U.S. PATENT DOCUMENTS

| 7,309,907 | B2 * | 12/2007 | De Jongh et al. ............. 257/577 |
| 2007/0236623 | A1 * | 10/2007 | Heo et al. ......................... 349/42 |
| 2008/0050852 | A1 * | 2/2008 | Hwang et al. ................... 438/30 |

* cited by examiner

*Primary Examiner* — Ngan Ngo
*Assistant Examiner* — Benjamin Tzu-Hung Liu
(74) *Attorney, Agent, or Firm* — Morgan, Lewis & Bockius LLP

(57) ABSTRACT

An array substrate for a liquid crystal display device includes: a gate line and a gate electrode on a substrate, the gate electrode connected to the gate line; a gate insulating layer on the gate line and the gate electrode, the gate insulating layer including an organic insulating material such that a radical of carbon chain has a composition ratio of about 8% to about 11% by weight; a semiconductor layer on the gate insulating layer over the gate electrode; a data line crossing the gate line to define a pixel region; source and drain electrodes on the semiconductor layer, the source electrode connected to the data line and the drain electrode spaced apart from the source electrode; a passivation layer on the data line, the source electrode and the drain electrode, the passivation layer having a drain contact hole exposing the drain electrode; and a pixel electrode on the passivation layer, the pixel electrode connected to the drain electrode through the drain contact hole.

7 Claims, 7 Drawing Sheets

ARRAY SUBSTRATE FOR LIQUID CRYSTAL DISPLAY DEVICE AND METHOD OF FABRICATING THE SAME

This application claims the benefit of Korean Patent Application No. 2008-0055048 filed on Jun. 12, 2008, which is hereby incorporated by reference in its entirety.

TECHNICAL FIELD

The present application relates to an array substrate for a liquid crystal display device, and more particularly, to an array substrate including a thin film transistor and a method of fabricating the array substrate.

BACKGROUND

In general, liquid crystal display (LCD) devices use the optical anisotropy and polarization properties of liquid crystal molecules in a liquid crystal layer to display images. Since the liquid crystal molecules have thin and long shapes, the polarization of light through the liquid crystal molecules varies with the alignment direction of the liquid crystal molecules. Accordingly, the LCD device displays an image by controlling the alignment of the liquid crystal molecules as well as the transmittance of light through the liquid crystal layer due to adjustment of the electric field applied to the liquid crystal layer. Active matrix liquid crystal display (AM-LCD) devices where thin film transistors (TFTs) and pixel electrodes are disposed in matrix have been the subject of recent researches because of their superiority in displaying moving images and high contrast ratio.

FIG. 1 is a cross-sectional view showing an array substrate for a liquid crystal display device according to the related art. In FIG. 1, a gate electrode 25 extending from a gate line (not shown) is formed on a substrate 10. A gate insulating layer 45 is formed on the gate electrode 25 and a semiconductor layer 42 is formed on the gate insulating layer 45 over the gate electrode 25. The semiconductor layer 42 includes an active layer of intrinsic amorphous silicon (a-Si:H) and an ohmic contact layer 41 of impurity-doped amorphous silicon (n+a-Si:H). In addition, source and drain electrodes 32 and 34 are formed on the semiconductor layer 42. The source electrode 32 extends from a data line (not shown) and the drain electrode 34 is spaced apart from the source electrode 32. The data line crosses the gate line to define a pixel region PA. A passivation layer 55 is formed on the source and drain electrodes 32 and 34, and a pixel electrode 70 is formed on the passivation layer 55. The passivation layer 55 includes a drain contact hole CH1 exposing the drain electrode 34, and the pixel electrode 70 is connected to the drain electrode 34 through the drain contact hole CH1.

The gate electrode 25, the gate insulating layer 45, the semiconductor layer 42, the source electrode 32 and the drain electrode 34 constitute a thin film transistor (TFT) T. The ohmic contact layer 41 is formed to correspond to the source and drain electrodes 32 and 34, and a portion of the active layer 40 exposed through the ohmic contact layer 41 is used as a channel region ch of the TFT T. When a gate signal of an OFF voltage level is applied to the gate electrode 25, the source and drain electrodes 32 and 34 are electrically disconnected and the TFT T is turned off. When a gate signal of an ON voltage level is applied to the gate electrode 25, the source and drain electrodes 32 and 34 are electrically connected and the TFT T is turned on. Accordingly, a data signal is applied to the pixel electrode 70 through the channel region ch. Further, liquid crystal molecules in a liquid crystal layer are re-arranged by an electric field generated between the pixel electrode 70 and a common electrode (not shown) so that the LCD device displays images.

The gate insulating layer 45 may be formed by a chemical vapor deposition (CVD) method using an inorganic insulating material such as silicon nitride (SiNx) and silicon oxide ($SiO_2$). Since the gate insulating layer 45 of the inorganic insulating material has an excellent interface property with the semiconductor layer 42, a mobility of charges passing through the channel region ch is improved. However, since the gate insulating layer 45 of the inorganic insulating material is formed by the CVD method, a production cost increases due to high price of a CVD apparatus and a fabrication time increases due to the CVD method using vacuum condition.

SUMMARY

An array substrate for a liquid crystal display device includes: a gate line and a gate electrode on a substrate, the gate electrode connected to the gate line; a gate insulating layer on the gate line and the gate electrode, the gate insulating layer including an organic insulating material such that a radical of carbon chain has a composition ratio of about 8% to about 11% by weight; a semiconductor layer on the gate insulating layer over the gate electrode; a data line crossing the gate line to define a pixel region; source and drain electrodes on the semiconductor layer, the source electrode connected to the data line and the drain electrode spaced apart from the source electrode; a passivation layer on the data line, the source electrode and the drain electrode, the passivation layer having a drain contact hole exposing the drain electrode; and a pixel electrode on the passivation layer, the pixel electrode connected to the drain electrode through the drain contact hole.

In another aspect, a method of fabricating an array substrate for a liquid crystal display device includes: forming a gate line and a gate electrode on a substrate, the gate electrode connected to the gate line; forming a gate insulating layer on the gate line and the gate electrode, the gate insulating layer including an organic insulating material such that a radical of carbon chain has a composition ratio of about 8% to about 11% by weight; forming a semiconductor layer on the gate insulating layer over the gate electrode; forming a data line on the gate insulating layer and source and drain electrodes on the semiconductor layer, the data line crossing the gate line to define a pixel region, the source electrode connected to the data line and the drain electrode spaced apart from the source electrode; forming a passivation layer on the data line, the source electrode and the drain electrode, the passivation layer having a drain contact hole exposing the drain electrode; and forming a pixel electrode on the passivation layer, the pixel electrode connected to the drain electrode through the drain contact hole.

BRIEF DESCRIPTION OF THE DRAWINGS

The accompanying drawings, which are included to provide a further understanding of the invention and are incorporated in and constitute a part of this specification, illustrate embodiments of the invention.

DETAILED DESCRIPTION OF THE EMBODIMENTS

Reference will now be made in detail to embodiments which are illustrated in the accompanying drawings. Wherever possible, similar reference numbers will be used to refer to the same or similar parts.

Figure 1:
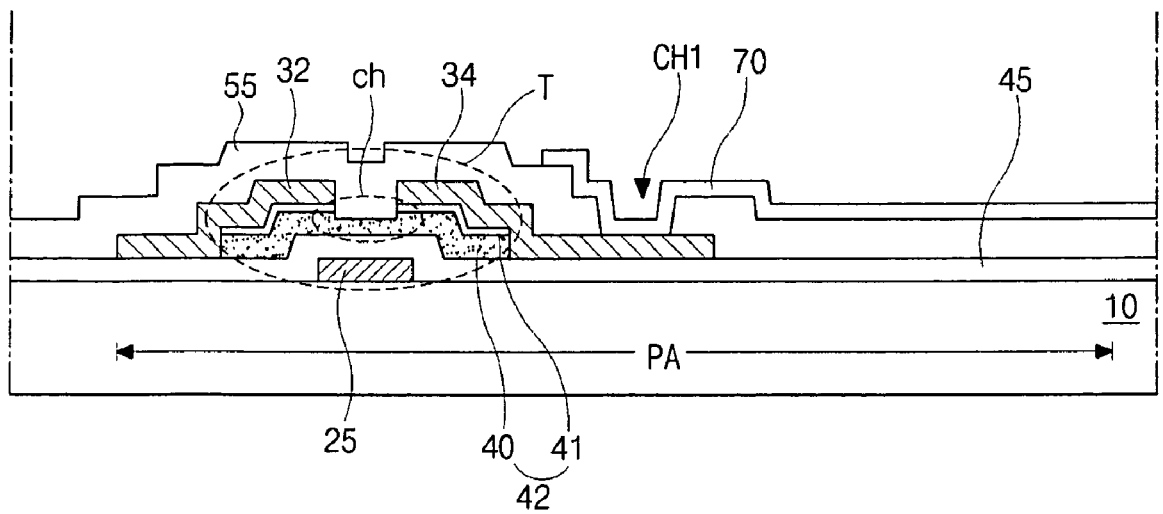
FIG. 1 is a cross-sectional view showing an array substrate for a liquid crystal display device according to the related art.
Figure 2:
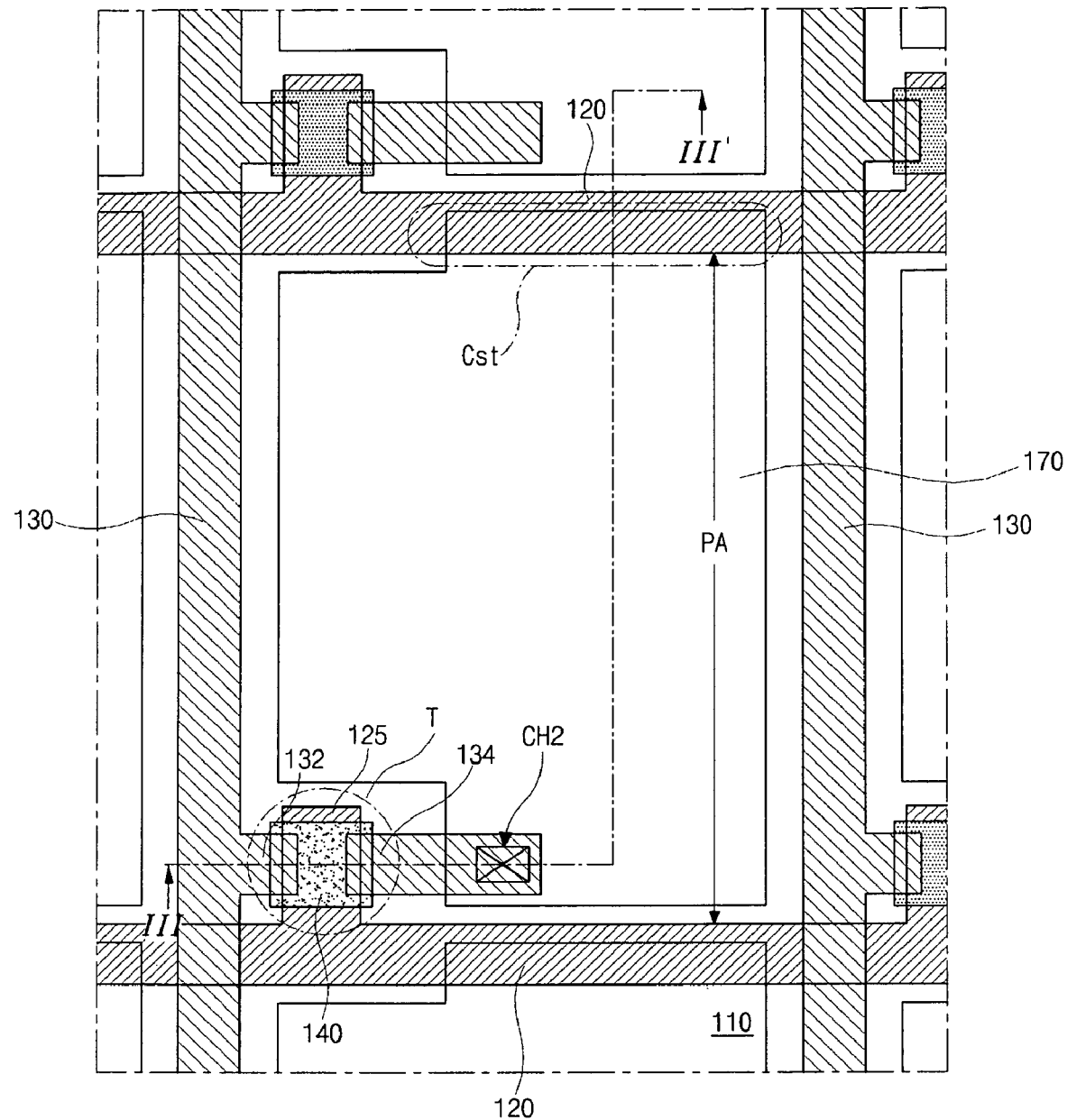
FIG. 2 is a plan view showing an array substrate for a liquid crystal display device according to an embodiment of the invention.
Figure 3:
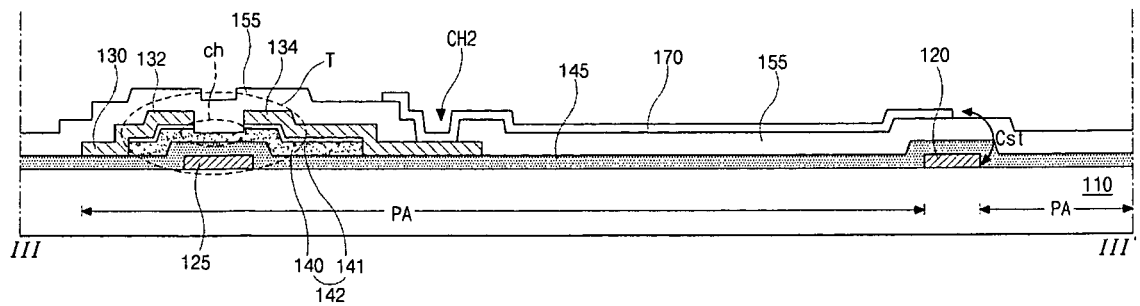
FIG. 3 is a cross-sectional view taken along a line III-III' of FIG. 2.

FIG. 2 is a plan view showing an array substrate for a liquid crystal display device according to an embodiment of the invention, and FIG. 3 is a cross-sectional view taken along a line III-III' of FIG. 2.

In FIGS. 2 and 3, a gate line 120 and a gate electrode 125 are formed on a substrate 110. The gate electrode 125 is connected to the gate line 120. A gate insulating layer 145 is formed on the gate line 120 and the gate electrode 125. The gate insulating layer 145 may be formed by coating with an organic material of a sol-gel type using one of an inkjet method, a nozzle coating method, a bar coating method, a slit coating method and a spin coating method. For example, the organic material may include a mixture of tetraethylorthosilicate (TEOS) and methyltrimethoxysilane (MTMS) or a mixture of TEOS, MTMS and metal oxide. After the substrate 110 having the gate line 120 and the gate electrode 125 is coated with the sol-gel type organic material, the gate insulating layer 145 may be cured through a hard baking step. For example, the gate insulating layer 145 may be cured under a temperature of about 100° C. to about 200° C. for about 1 min to about 30 min.

A semiconductor layer 142 is formed on the gate insulating layer 145. The semiconductor layer 142 includes an active layer 140 of intrinsic amorphous silicon and an ohmic contact layer 141 of impurity-doped amorphous silicon. A data line 130 is formed on the gate insulating layer 145, and source and drain electrodes 132 and 134 are formed on the semiconductor layer 142. The data line 130 crosses the gate line 120 to define a pixel region PA. The source electrode 132 is connected to the data line 130 and the drain electrode 134 is spaced apart from the source electrode 132. The gate electrode 125, the gate insulating layer 145, the semiconductor layer 142, the source electrode 132 and the drain electrode 134 constitute a thin film transistor (TFT) T. Since the ohmic contact layer 141 corresponding to a space between the source and drain electrodes 132 and 134 is removed, the active layer 140 is exposed through the space between the source and drain electrodes 132 and 134 to be used as a channel region ch of the TFT T.

A passivation layer 155 is formed on the data line 130, the source electrode 132 and the drain electrode 134, and a pixel electrode 170 is formed on the passivation layer 155 in the pixel region PA. The passivation layer 155 includes a drain contact hole CH2 exposing the drain electrode 134, and the pixel electrode 170 is connected to the drain electrode 134 through the drain contact hole CH2. The pixel electrode 170 may include a transparent conductive material such as indium-tin-oxide (ITO) and indium-zinc-oxide (IZO). In addition, the pixel electrode 170 may extend to overlap the gate line 120 of a previous pixel region (a previous gate line). As a result, the overlap of the gate line 120 and the pixel electrode 170 may form a storage capacitor Cst including an overlapped portion of the gate line 120 as a first capacitor electrode, an overlapped portion of the pixel electrode 170 as a second capacitor electrode and a portion of the gate insulating layer 145 and the passivation layer 155 between the first and second capacitor electrodes as a dielectric layer.

Since the gate insulting layer 145 includes the sol-gel type organic insulating material, a molecule of the gate insulating layer 145 may include a radical of carbon (C) chain such as alkyl group. For example, when a mixture of TEOS and MTMS having a volume ratio of about 3:7 is used for the gate insulating layer 145, a radical of carbon chain in a molecule of the gate insulating layer 145 may have a composition ratio over about 30% by weight. In addition, when a mixture of TEOS and MTMS having a volume ratio of about 1:1 is used for the gate insulating layer 145, a radical of carbon chain in a molecule of the gate insulating layer 145 may have a composition ratio of about 8% by weight to about 11% by weight. The radical of carbon chain functions as a trap capturing carriers passing through the channel region ch, thereby deteriorating a property of the TFT T. Accordingly, the gate insulating layer 145 where the composition ratio of the radical of carbon chain is within a range of about 8% to about 11% provides a better TFT property than the gate insulating layer 145 where the composition ratio of the radical of carbon chain is over about 30%.

In addition, to increase a dielectric constant of the gate insulating layer 145, a metal oxide may be added to the mixture of TEOS and MTMS. For example, the gate insulating layer 145 may be formed using a mixture of TEOS, MTMS and metal oxide having a volume ratio of about 1:1:1. Since the gate insulating layer 145 of an organic material is formed by a coating method instead of a high cost fabrication method such as a CVD method and provides an excellent TFT property, production cost is reduced and process efficiency is improved.

FIGS. 4A to 4F are cross-sectional views showing a method of fabricating an array substrate for a liquid crystal display device according to an embodiment of the invention.

Figure 4A:
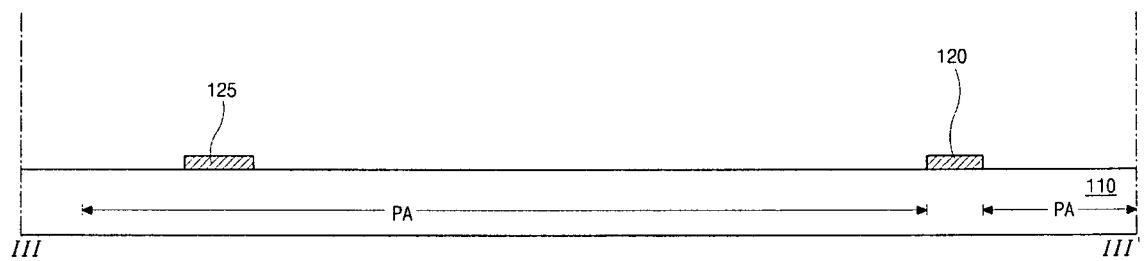
FIGS. 4A to 4F are cross-sectional views showing a method of fabricating an array substrate for a liquid crystal display device according to an embodiment of the invention.

In FIG. 4A, a gate line 120 and a gate electrode 125 connected to the gate line 120 are formed on a substrate 110 having a pixel region PA. The gate line 120 and the gate electrode 125 may include a conductive metallic material such as copper (Cu), molybdenum (Mo), aluminum (Al) and aluminum (Al) alloy.

Figure 4B:
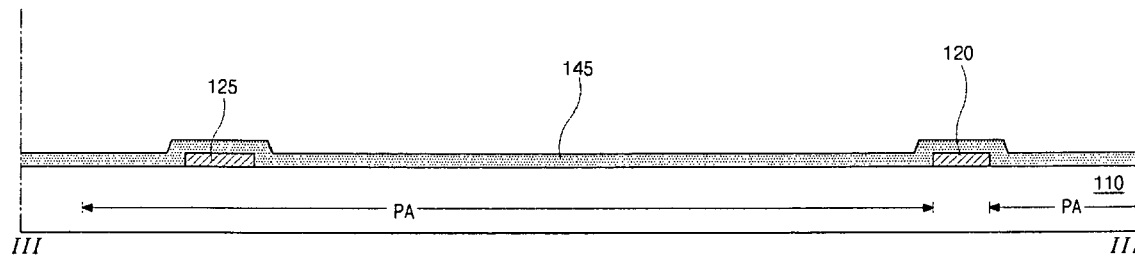

In FIG. 4B, a gate insulating layer 145 is formed on the gate line 120 and the gate electrode 125 by coating with a mixture of sol-gel type organic materials. For example, a mixture of TEOS and MTMS or a mixture of TEOS, MTMS and metal oxide may be used for the gate insulating layer 145. In addition, one of an inkjet method, a nozzle coating method, a bar coating method, a slit coating method and a spin coating method and a corresponding apparatus may be used for the gate insulating layer 145. After the substrate 110 having the gate line 120 and the gate electrode 125 is coated with the mixture of sol-gel type organic materials, the gate insulating layer 145 is cured through a hard baking step.

Figure 5A:
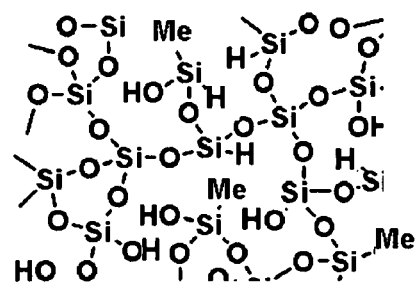
FIGS. 5A and 5B are views showing a random structure and a ladder structure, respectively, of a gate insulating layer of an array substrate for a liquid crystal display device according to an embodiment of the invention.
Figure 5B:
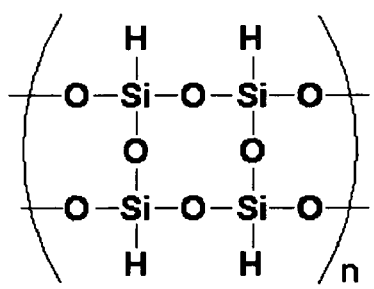

The gate insulating layer 145 may have one of a random structure, a ladder structure, a mixed structure of random and ladder. FIGS. 5A and 5B are views showing a random structure and a ladder structure, respectively, of a gate insulating layer of an array substrate for a liquid crystal display device according to an embodiment of the invention. As shown in FIGS. 5A and 5B, hydrogen H and oxygen O are randomly combined with silicon Si in a random structure, while hydrogen H and oxygen O are periodically combined with silicon in a ladder structure.

Since the gate insulting layer 145 includes the sol-gel type organic insulating material, a molecule of the gate insulating layer 145 may include a radical of carbon (C) chain. For example, the carbon chain may include alkyl group having one of a methyl group ($-CH_3$), an ethyl group ($-CH_2CH_3$) and a propyl group ($-CH_2CH_2CH_3$). In addition, a radical of carbon chain in a molecule of the gate insulating layer 145 may have a composition ratio over about 30% by weight when a mixture of TEOS and MTMS having a volume ratio of about 3:7 is used, while a radical of carbon chain in a molecule of the gate insulating layer 145 may have a composition ratio of about 8% by weight to about 11% by weight when a mixture of TEOS and MTMS having a volume ratio of about 1:1 is used. The radical of carbon chain functions as a trap capturing carriers passing through the channel region ch, thereby deteriorating a property of the TFT. Accordingly, the gate insulating layer 145 where the composition ratio of the radical of carbon chain is within a range of about 8% to about 11% provides a better TFT property than the gate insulating layer 145 where the composition ratio of the radical of carbon chain is over about 30%.

Specifically, FIG. 5A shows metallic material Me in the gate insulating layer 145 when a mixture of TEOS, MTMS and metal oxide is used. For example, when a mixture of TEOS and MTMS is used for the gate insulating layer 145, the gate insulating layer 145 may have a relatively low dielectric constant. The relatively low dielectric constant prevents the polarization in the gate insulating layer 145 and the generation of a channel for current in the TFT. To increase dielectric constant of the gate insulating layer 145, metal oxide may be added to the mixture of TEOS and MTMS. For example, the gate insulating layer 145 formed by using the mixture of TEOS, MTMS and metal oxide having a volume ratio of about 1:1:1 may have a dielectric constant of about 8 to about 10. The metal oxide may include one of zinc oxide, barium strontium titanate, barium zirconate titanate, lead zirconate titanate, lead lanthanum titanate, strontium titanate, barium titanate, barium magnesium fluoride, bismuth titanate, strontium bismuth tantalite, strontium bismuth tantalite niobate, aluminum oxide ($Al_2O_3$), magnesium oxide (MgO), calcium oxide (CaO), zirconium silicate ($ZrSiO_4$), hafnonium silicate ($HfSiO_4$), yttrium oxide ($Y_2O_3$), zircon oxide ($ZrO_2$), hafnon oxide ($HfO_2$), strontium oxide (SrO), lanthanium oxide ($La_2O_3$), tantalum oxide ($Ta_2O_5$), barium oxide (BaO) and titanium oxide ($TiO_2$).

Figure 4C:
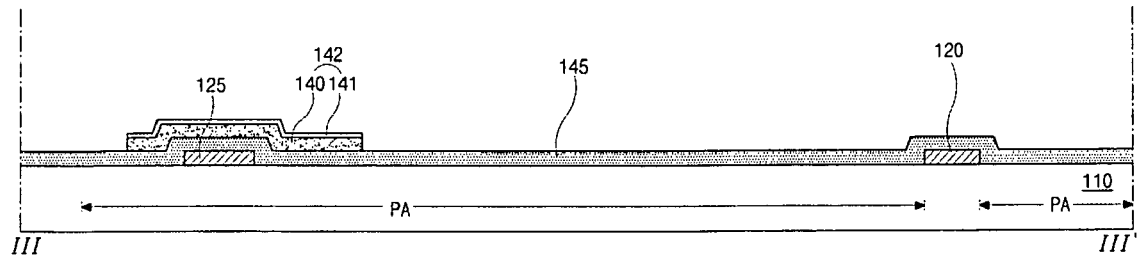

In FIG. 4C, a semiconductor layer 142 is formed on the gate insulating layer 145 over the gate electrode 125 by depositing and patterning intrinsic amorphous silicon (a-Si:H) and impurity-doped amorphous silicon (n+a-Si:H). The semiconductor layer 142 includes an active layer 140 of intrinsic amorphous silicon (a-Si:H) and an ohmic contact layer 141 of impurity-doped amorphous silicon (n+a-Si:H).

Figure 4D:
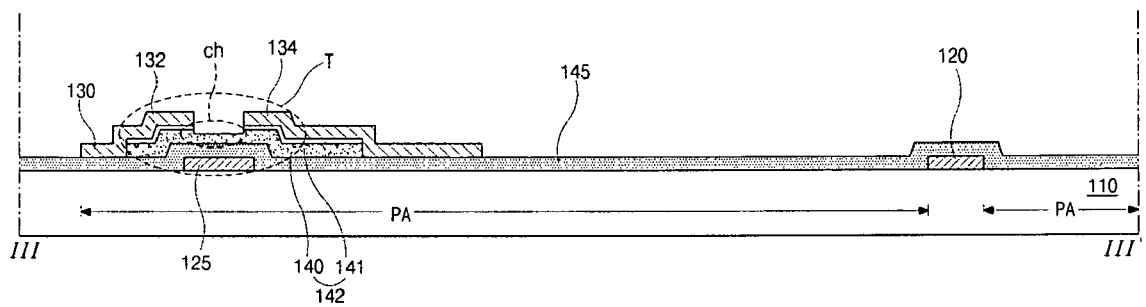

In FIG. 4D, source and drain electrodes 132 and 134 are formed on the semiconductor layer 142. Although not shown in FIG. 4D, a data line crossing the gate line 120 to define the pixel region PA is formed on the gate insulating layer 145. The source electrode 132 is connected to the data line and the drain electrode 134 is spaced apart from the source electrode 132. The data line, the source electrode 132 and the drain electrode 134 may include a conductive metallic material such as copper (Cu), molybdenum (Mo), aluminum (Al) and aluminum (Al) alloy.

Next, the ohmic contact layer 141 is patterned using the source and drain electrodes 132 and 134 as an etch mask to expose the active layer 140. The gate electrode 125, the gate insulating layer 145, the semiconductor layer 142, the source electrode 132 and the drain electrode 134 constitute a thin film transistor (TFT) T and the exposed portion of the active layer 140 is used as a channel region ch of the TFT T. Since the gate insulating layer 145 is formed by coating with a mixture of organic materials, production cost and process efficiency are improved. In addition, since a radical of carbon chain in the gate insulating layer 145 has a composition ratio of about 8% to about 11% by weight due to a mixture of TEOS and MTMS having a volume ratio of about 1:1, electrical properties of the TFT T are improved. Moreover, dielectric constant of the gate insulating layer 145 is improved by using a mixture of TEOS, MTMS and metal oxide having a volume ratio of about 1:1:1.

Figure 4E:
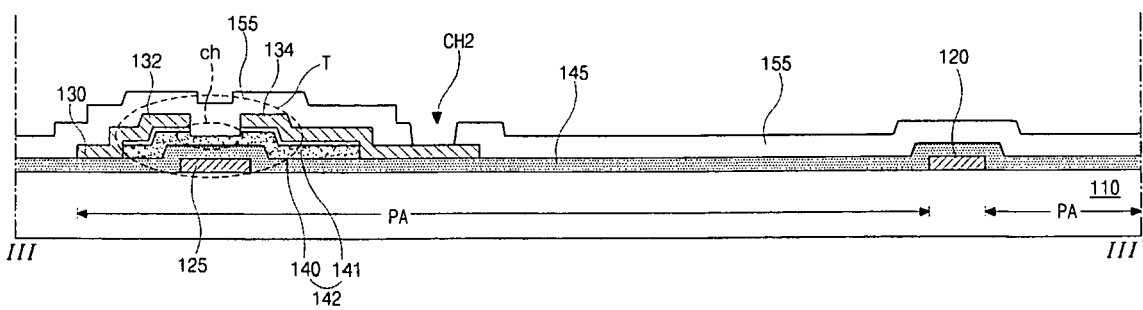

In FIG. 4E, a passivation layer 155 is formed on the data line, the source electrode 132 and the drain electrode 134. The passivation layer 155 may include one of an inorganic insulating material such as silicon nitride (SiNx) and silicon oxide ($SiO_2$) and an organic insulating material such as benzocyclobutene (BCB) and acrylic resin. The passivation layer 155 has a drain contact hole CH2 exposing the drain electrode 134.

Figure 4F:
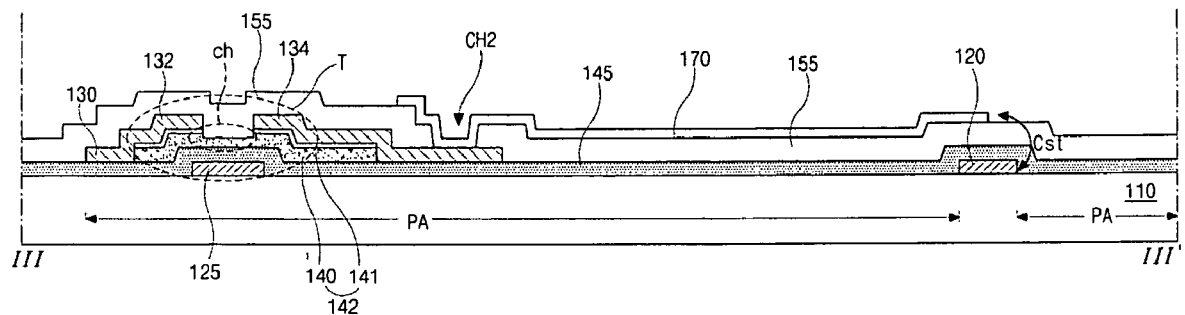

In FIG. 4F, a pixel electrode 170 is formed on the passivation layer 155 in the pixel region PA. The pixel electrode 170 may include one of indium-tin-oxide (ITO) and indium-zinc-oxide (IZO). The pixel electrode 170 is connected to the drain electrode 134 through the drain contact hole CH2. In addition, the pixel electrode 170 may extend to overlap the gate line 120 of a previous pixel region (a previous gate line). As a result, the overlap of the gate line 120 and the pixel electrode 170 may form a storage capacitor Cst including an overlapped portion of the gate line 120 as a first capacitor electrode, an overlapped portion of the pixel electrode 170 as a second capacitor electrode and a portion of the gate insulating layer 145 and the passivation layer 155 between the first and second capacitor electrodes as a dielectric layer.

Although an array substrate having a gate insulating layer of an organic insulating material is fabricated by a five-mask process in FIGS. 4A to 4F, an array substrate having a gate insulating layer of an organic insulating material may fabricated by one of a four-mask process and a three-mask process in another embodiment.

Figure 6A:
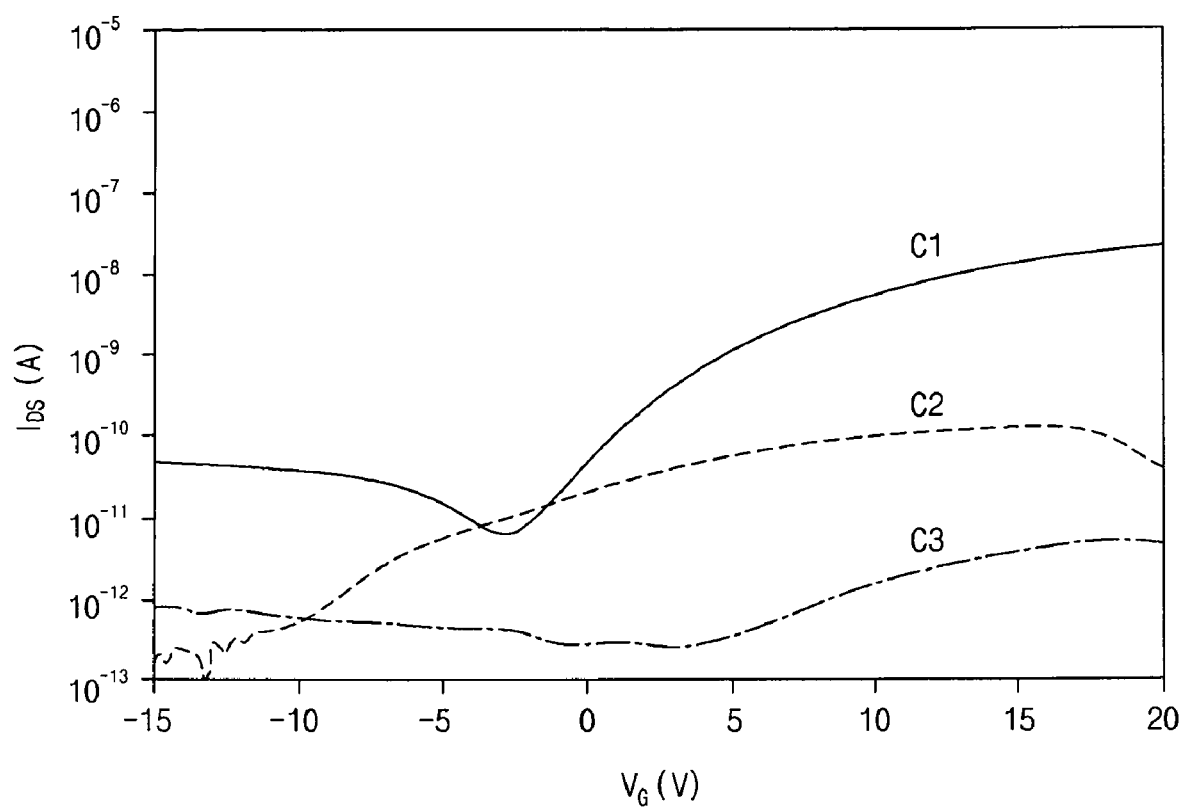
FIG. 6A is a view showing a current-voltage (I-V) characteristic of a thin film transistor where a radical of carbon chain in a first gate insulating layer has a composition ratio over about 30% by weight according to an embodiment of the invention.
Figure 6B:
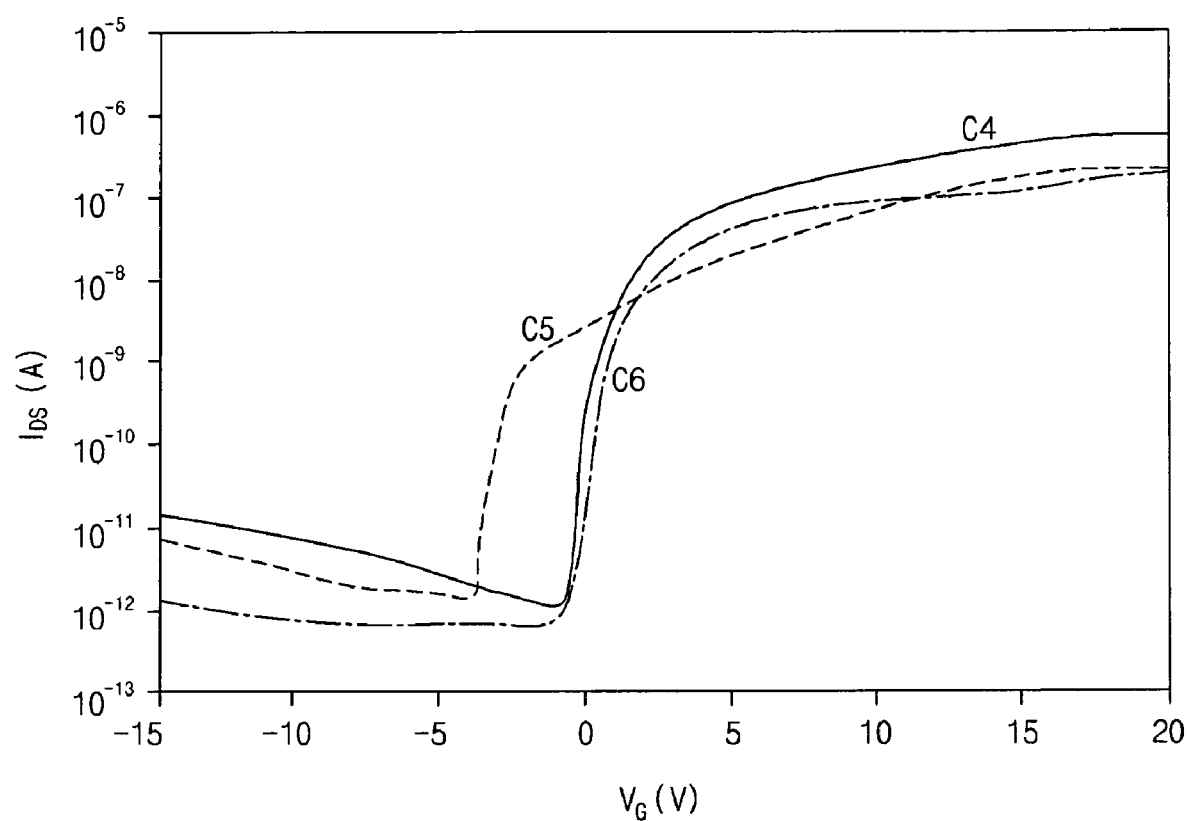
FIG. 6B is a view showing a current-voltage (I-V) characteristic of a thin film L transistor where a radical of carbon chain in a second gate insulating layer has a composition ratio of about 8% by weight to about 11% by weight according to embodiments of the invention.

FIG. 6A is a view showing a current-voltage (I-V) characteristic of a thin film transistor where a radical of carbon chain in a first gate insulating layer has a composition ratio over about 30% by weight according to an embodiment of the invention, and FIG. 6B is a view showing a current-voltage (I-V) characteristic of a thin film transistor where a radical of carbon chain in a second gate insulating layer has a composition ratio of about 8% by weight to about 11% by weight according to an embodiment of the invention. The first gate insulating layer may be formed by using a mixture of TEOS and MTMS having a volume ratio of about 3:7, and the second gate insulating layer may be formed by using one of a mixture of TEOS and MTMS having a volume ratio of about 1:1 and a mixture of TEOS, MTMS and metal oxide having a volume ratio of about 1:1:1.

In FIGS. 6A and 6B, each of first to sixth curves C1 to C6 shows a source-drain current IDS between source and drain electrodes according to a gate voltage $V_G$ of a gate electrode. The first and fourth curves C1 and C4 correspond to TFTs before a stress bias is applied to the gate electrode. In addition, the second and fifth curves C2 and C5 correspond to TFTs after a negative stress bias of about −20V is applied to the gate electrode during a predetermined time period, and the third and sixth curves C3 and C6 correspond to TFTs after a positive stress bias of about +20V is applied to the gate electrode during a predetermined time period.

The second and third curves C2 and C3 show a gentle change in the source-drain current IDS at the gate voltage $V_G$ of about −5V to about 0V corresponding to a threshold voltage of the TFT. Before a semiconductor layer is formed on the first gate insulating layer having a composition ratio of the radical of carbon chain over about 30% by weight, the first gate insulating layer is treated with a hydrogen ($H_2$) plasma. The radical of carbon chain is combined with hydrogen during the hydrogen ($H_2$) plasma treatment and the combination of the radical of carbon chain and hydrogen functions as a trap capturing carriers passing through the channel region ch. Accordingly, the first gate insulating layer has defects and the TFT including the first gate insulating layer is deteriorated after the negative and positive stress biases are applied.

The fifth and sixth curves C5 and C6 show a steep change in the source-drain current IDS at the gate voltage $V_G$ of about −5V to about 0V corresponding to a threshold voltage of the TFT. Since the second gate insulating layer has a relatively low composition ratio of a radical of carbon chain, e.g., about 8% to about 11% by weight, the combination of the radical of carbon chain and hydrogen is reduced. Accordingly, the second gate insulating layer is improved and electrical properties of the TFT including the second gate insulating layer are not deteriorated even after the negative and positive stress biases are applied. As a result, the second gate insulating layer of an organic insulating material may have a property corresponding to that of a gate insulating layer of an inorganic insulating material, and production cost is reduced with increase of process efficiency.

It will be apparent to those skilled in the art that various modifications and variations can be made in an array substrate for a liquid crystal display device and a method of fabricating the array substrate of embodiments of the invention without departing from the spirit or scope of the invention. Thus, it is intended that embodiments of the invention cover the modifications and variations of this invention provided they come within the scope of the appended claims and their equivalents.

What is claimed is:

1. A method of fabricating an array substrate for a liquid crystal display device, comprising:
   forming a gate line and a gate electrode on a substrate, the gate electrode connected to the gate line;
   forming a gate insulating layer on the gate line and the gate electrode, the gate insulating layer including an organic insulating material such that a radical of carbon chain has a composition ratio of about 8% to about 11% by weight;
   forming a semiconductor layer on the gate insulating layer over the gate electrode;
   forming a data line on the gate insulating layer and source and drain electrodes on the semiconductor layer, the data line crossing the gate line to define a pixel region, the source electrode connected to the data line and the drain electrode spaced apart from the source electrode;
   forming a passivation layer on the data line, the source electrode and the drain electrode, the passivation layer having a drain contact hole exposing the drain electrode; and
   forming a pixel electrode on the passivation layer, the pixel electrode connected to the drain electrode through the drain contact hole,
   wherein forming the gate insulating layer comprises:
      coating the substrate having the gate line and the gate electrode with a mixture of TEOS, MTMS and metal oxide; and
      curing the gate insulating layer.

2. The method according to claim 1, wherein the TEOS, MTMS and metal oxide of the mixture has a volume ratio of about 1:1:1.

3. The method according to claim 1, wherein the substrate having the gate line and the gate electrode is coated with the mixture using one of an inkjet method, a nozzle coating method, a bar coating method, a slit coating method and a spin coating method.

4. The method according to claim 1, wherein the metal oxide of the mixture includes one of zinc oxide, barium strontium titanate, barium zirconate titanate, lead zirconate titanate, lead lanthanum titanate, strontium titanate, barium titanate, barium magnesium fluoride, bismuth titanate, strontium bismuth tantalite, strontium bismuth tantalite niobate, aluminum oxide ($Al_2O_3$), magnesium oxide (MgO), calcium oxide (CaO), zirconium silicate ($ZrSiO_4$), hafnonium silicate ($HfSiO_4$), yttrium oxide ($Y_2O_3$), zircon oxide ($ZrO_2$), hafnon oxide ($HfO_2$), strontium oxide (SrO), lanthanium oxide ($La_2O_3$), tantalum oxide ($Ta_2O_5$), barium oxide (BaO) and titanium oxide ($TiO_2$).

5. The method according to claim 1, wherein the gate insulating layer has a dielectric constant of about 8 to about 10.

6. The method according to claim 1, wherein the gate insulating layer has one of a random structure, a ladder structure and a mixed structure of random and ladder.

7. The method according to claim 1, further comprising treating the gate insulating layer with a hydrogen ($H_2$) plasma before forming the semiconductor layer.

* * * * *